(12) United States Patent
Luan

(10) Patent No.: US 9,698,105 B2
(45) Date of Patent: Jul. 4, 2017

(54) ELECTRONIC DEVICE WITH REDISTRIBUTION LAYER AND STIFFENERS AND RELATED METHODS

(71) Applicant: STMICROELECTRONICS PTE LTD, Singapore (SG)

(72) Inventor: Jing-En Luan, Shenzhen (CN)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 15/251,209

(22) Filed: Aug. 30, 2016

(65) Prior Publication Data

US 2016/0372426 A1    Dec. 22, 2016

Related U.S. Application Data

(63) Continuation of application No. 14/741,535, filed on Jun. 17, 2015, now Pat. No. 9,466,550.

(30) Foreign Application Priority Data

Oct. 11, 2014   (CN) .......................... 2014 1 0537567

(51) Int. Cl.
   *H01L 23/34*   (2006.01)
   *H01L 23/00*   (2006.01)
   (Continued)

(52) U.S. Cl.
   CPC ........ *H01L 23/562* (2013.01); *H01L 21/4846* (2013.01); *H01L 21/4853* (2013.01); *H01L 21/4871* (2013.01); *H01L 21/4882* (2013.01); *H01L 21/565* (2013.01); *H01L 21/78* (2013.01); *H01L 23/18* (2013.01); *H01L 23/3107* (2013.01); *H01L 23/3114* (2013.01); *H01L 23/367* (2013.01); *H01L 23/3672* (2013.01); *H01L 23/3675* (2013.01); *H01L 23/373* (2013.01); *H01L 23/498* (2013.01); *H01L 23/49838* (2013.01); *H01L 23/49894* (2013.01); *H01L 23/5389* (2013.01); *H01L 24/16* (2013.01); *H01L 24/19* (2013.01); (Continued)

(58) Field of Classification Search
   CPC ... H01L 23/562; H01L 23/18; H01L 23/3672; H01L 23/49838; H01L 23/3114; H01L 23/373; H01L 23/49894; H01L 23/49816; H01L 23/3107; H01L 21/4882; H01L 21/4853; H01L 21/565; H01L 21/78
   USPC ........................................ 438/108, 612, 614
   See application file for complete search history.

(56) References Cited

U.S. PATENT DOCUMENTS 6,724,080 B1    4/2004   Ooi
6,841,883 B1    1/2005   Farnworth et al.
(Continued)

*Primary Examiner* — (Vikki) Hoa B Trinh
(74) *Attorney, Agent, or Firm* — Slater Matsil, LLP

(57) ABSTRACT

A method includes forming a molded panel that includes a number of integrated circuits, fan-out components and stiffeners embedded in an encapsulation material. A redistribution layer is formed over the integrated circuits and the fan-out components. The redistribution layer is electrically coupled to contacts of the integrated circuits. The molded panel is singulated to form electronic devices. Each electronic device each an integrated circuit that is separated from a fan-out component by a portion of the encapsulation material and a stiffener separated from the fan-out component by a second portion of the encapsulation material.

21 Claims, 6 Drawing Sheets

(51) Int. Cl.
   *H01L 23/373*  (2006.01)
   *H01L 23/498*  (2006.01)
   *H01L 23/367*  (2006.01)
   *H01L 23/31*   (2006.01)
   *H01L 21/48*   (2006.01)
   *H01L 23/538*  (2006.01)
   *H01L 21/56*   (2006.01)
   *H01L 21/78*   (2006.01)
   *H01L 23/18*   (2006.01)

(52) U.S. Cl.
   CPC .............. *H01L 24/20* (2013.01); *H01L 24/96* (2013.01); *H01L 24/97* (2013.01); *H01L 21/568* (2013.01); *H01L 23/3737* (2013.01); *H01L 23/49816* (2013.01); *H01L 2224/04105* (2013.01); *H01L 2224/12105* (2013.01); *H01L 2224/16235* (2013.01); *H01L 2224/18* (2013.01); *H01L 2224/32245* (2013.01); *H01L 2224/73267* (2013.01); *H01L 2924/3511* (2013.01)

(56) References Cited

U.S. PATENT DOCUMENTS

| | | |
|---|---|---|
| 7,619,901 B2 | 11/2009 | Eichelberger et al. |
| 8,008,125 B2 | 8/2011 | McConnelee et al. |
| 2007/0289127 A1 | 12/2007 | Hurwitz |
| 2010/0007017 A1 | 1/2010 | Wei et al. |
| 2012/0292745 A1* | 11/2012 | Park .................. H01L 23/3128 257/621 |
| 2016/0155682 A1 | 6/2016 | Ahuja et al. |

* cited by examiner

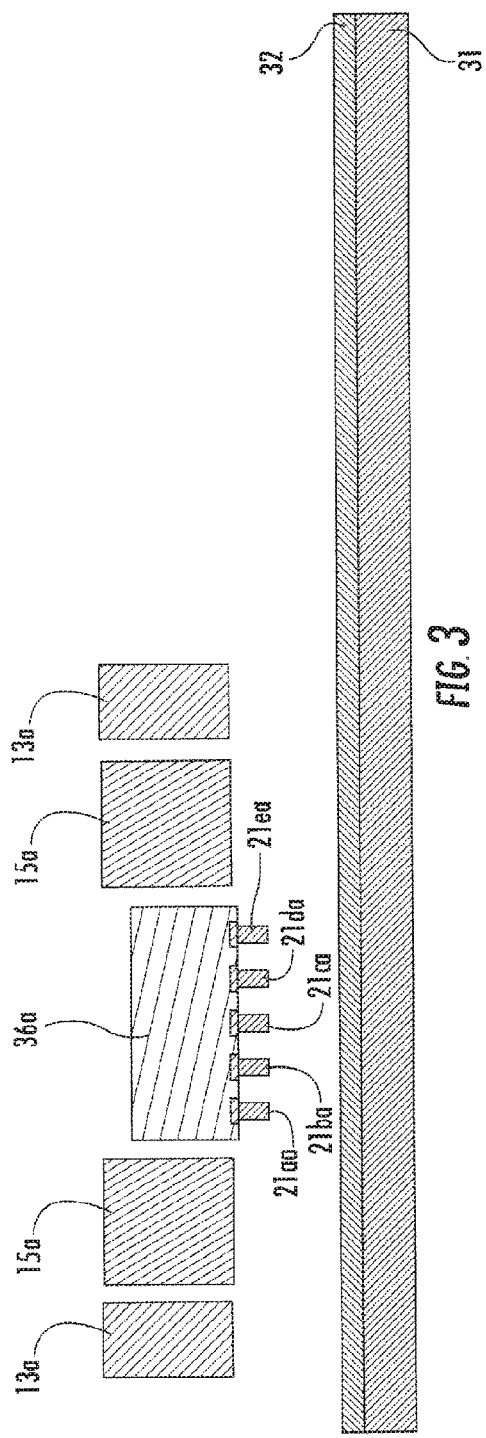
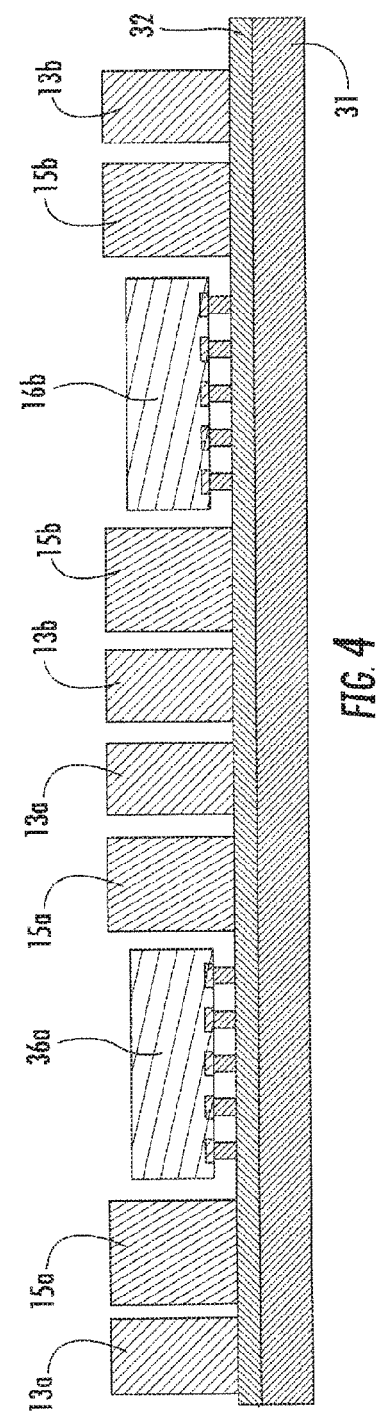

ELECTRONIC DEVICE WITH REDISTRIBUTION LAYER AND STIFFENERS AND RELATED METHODS

CROSS-REFERENCE TO RELATED APPLICATIONS

This application is a divisional of U.S. patent application Ser. No. 14/741,535 filed Jun. 17, 2015, which is claims priority to Chinese Application No. 201410537567.2 filed Oct. 11, 2014, each of which is incorporated herein by reference in its entirety.

TECHNICAL FIELD

The present disclosure relates to the field of integrated circuit devices, and, more particularly, to packaging of integrated circuit devices and related methods.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via solder bumps.

One approach to IC packaging comprises a quad-flat no-leads (QFN) package. The QFN package may provide some advantages, such as reduced lead inductance, a near chip scale footprint, thin profile, and low weight. Also, the QFN package typically includes perimeter I/O pads to ease circuit board trace routing, and the exposed copper die-pad technology offers enhanced thermal and electrical performance. QFN packaging may be well suited for applications where size, weight, and thermal and electrical performance are important.

Referring initially to FIG. 1, a typical ball grid array (BGA) electronic device 200 is now described. The electronic device 200 includes a heat sink layer 201, a pair of stiffeners 203a-203b, and an adhesive layer 202a, 202c between the stiffeners and the heat sink layer. The electronic device 200 includes a circuit board layer 205 having electrically conductive traces 208 therein, another adhesive layer 204a-204b between the circuit board layer and the stiffeners 203a-203b, and a plurality of ball contacts 207a-207l carried by the circuit board layer. The electronic device 200 includes an IC 206, a plurality of ball contacts 209a-209j coupling the IC to the circuit board layer 205, an adhesive layer 202b between the heat sink layer 201 and the IC, and an under fill material 210 around the IC and surrounding the plurality of ball contacts.

SUMMARY

Generally, an electronic device may include an IC, a plurality of electrically conductive connectors coupled to the IC, and a heat sink layer adjacent the IC and opposite the plurality of electrically conductive connectors. The electronic device may include an encapsulation material surrounding the IC and the plurality of electrically conductive connectors, a redistribution layer having a plurality of electrically conductive traces coupled to the plurality of electrically conductive connectors, a stiffener between the heat sink layer and the redistribution layer, and a fan-out component between the heat sink layer and the redistribution layer and being in the encapsulation material.

More specifically, the electronic device may further include a thermal interface layer between the heat sink layer and the IC. The electronic device may further comprise a plurality of electrically conductive solder balls coupled to the redistribution layer. The stiffener may have an inner surface adjacent the encapsulation material and an outer surface defining an external surface of the electronic device. The stiffener may abut and retain the encapsulation material.

The redistribution layer may comprise a dielectric layer. The plurality of electrically conductive traces is carried by the dielectric layer and coupled to the plurality of electrically conductive connectors. The fan-out component may comprise a ceramic material, for example. The plurality of electrically conductive connectors may comprise at least one of a solder bump and a pillar.

Another aspect is directed to a method of making an electronic device. The method may include forming a plurality of electrically conductive connectors coupled to an IC, positioning a heat sink layer adjacent the IC and opposite the plurality of electrically conductive connectors, and forming an encapsulation material surrounding the IC and the plurality of electrically conductive connectors. The method may include positioning a redistribution layer having a plurality of electrically conductive traces coupled to the plurality of electrically conductive connectors, positioning a stiffener between the heat sink layer and the redistribution layer, and positioning a fan-out component between the heat sink layer and the redistribution layer and being in the encapsulation material.

BRIEF DESCRIPTION OF THE DRAWINGS

FIGS. 3-9 are cross-section views of steps in the method for making the electronic device of FIG. 2.

DETAILED DESCRIPTION OF ILLUSTRATIVE EMBODIMENTS

There may some potential drawbacks to the prior art electronic device 200. The electronic device 200 may have reliability issues with the ball contacts 207a-207l, 209a-209j due to coefficient of thermal expansion (CTE) mismatch. The electronic device 200 may suffer from warping due to external physical forces and heat. Also, the design of the electronic device 200 generates a costly manufacturing process with reduced yield. The electronic device 200 also suffers from having a large package size with a thick profile, poor routing, poor heat dispersion, poor noise control, and poor radio frequency (RF) shielding.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 2:
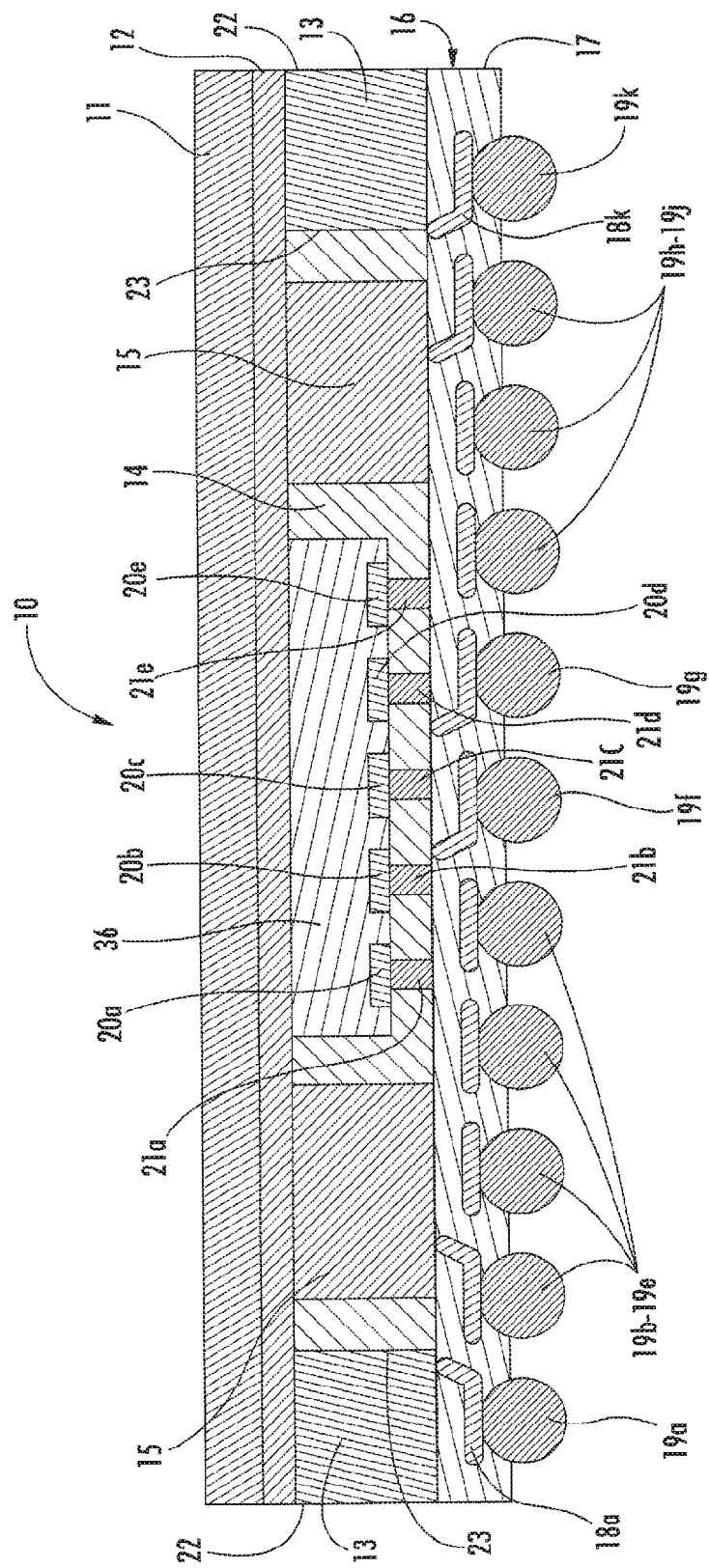
FIG. 2 is a cross-section view of an electronic device, according to the present disclosure.

Referring to FIG. 2, an electronic device 10 according to the present disclosure is now described. The electronic device 10 illustratively includes an IC 36 having a plurality of electrically conductive contacts 20a-20e, a plurality of electrically conductive connectors 21a-21e coupled to the electrically conductive contacts of the IC, and a heat sink layer 11 adjacent the IC and opposite the plurality of electrically conductive connectors. The plurality of electrically conductive connectors 21a-21e may comprise a plurality of solder bumps, or a plurality of pillars (e.g., copper, aluminum).

The electronic device 10 illustratively includes an encapsulation material 14 surrounding the IC 36 and the plurality of electrically conductive connectors 21a-21e, a redistribution layer 16 having a plurality of electrically conductive traces 18a-18k coupled to the plurality of electrically conductive connectors, a stiffener 13 between the heat sink layer 11 and the redistribution layer, and a fan-out component 15 between the heat sink layer and the redistribution layer and being in the encapsulation material. The fan-out component 15 may comprise a ceramic and/or organic material, for example. The fan-out component 15 is laterally positioned between the stiffener 13 and the IC 36. Helpfully, the prior art problem with mismatch in the CTE of the circuit board layer 205 and the ball contacts 207a-207l, 209a-209j is addressed.

More specifically, the electronic device 10 illustratively includes a thermal interface layer 12 between the heat sink layer 11 and the IC 36. The electronic device 10 illustratively includes a plurality of electrically conductive solder balls 19a-19k carried by the redistribution layer 16 to provide a BGA style connection.

The stiffener 13 coefficient of thermal expansion (CTE) has an inner surface 23 adjacent the encapsulation material 14 and an outer surface 22 defining an external surface of the electronic device 10. The stiffener 13 may abut and/or retain the encapsulation material 14 with the inner surface 23.

Figure 1:
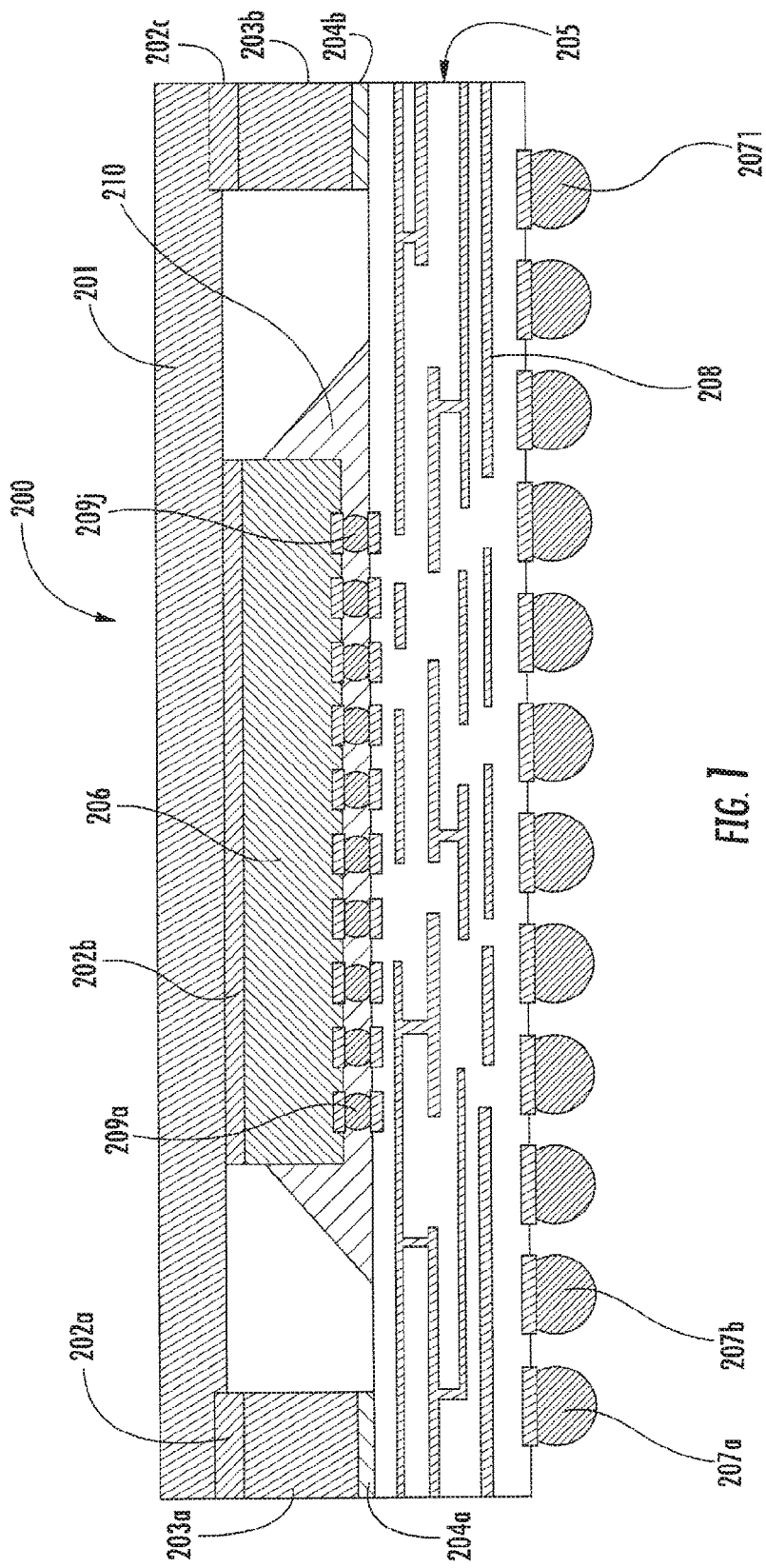
FIG. 1 is a cross-section view of an electronic device, according to the prior art.

The redistribution layer 16 illustratively includes a dielectric layer 17. The plurality of electrically conductive traces 18a-18k is carried by the dielectric layer 17 and coupled to the plurality of electrically conductive connectors 21a-21e. Advantageously, the electronic device 10 uses no substrate under the IC 36, as in the prior art approach of FIG. 1. In the electronic device 10, the substrate is replaced with the redistribution layer 16.

Additionally, advantageously, the electronic device 10 may also be manufactured using wafer level packaging technology, and can include integrated electronic components, such as a capacitor. Also, the electronic device 10 lacks a silicon interposer for fan out, which has instead been moved to the side. The electronic device 10 also has improved reliability as compared with the prior art design, and addresses the conflict of the flip-chip bump reliability and BGA joint reliability. In addition, the electronic device 10 has improved heat dispersion efficiency, reduced warping, and low mismatch in the CTE in the materials.

Another aspect is directed to a method of making the electronic device 10. The method may include forming a plurality of electrically conductive connectors 21a-21e coupled to an IC 36, positioning a heat sink layer 11 adjacent the IC and opposite the plurality of electrically conductive connectors, and forming an encapsulation material 14 surrounding the IC and the plurality of electrically conductive connectors. The method may include positioning a redistribution layer 16 having a plurality of electrically conductive traces 18a-18k coupled to the plurality of electrically conductive connectors 21a-21e, positioning a stiffener 13 between the heat sink layer 11 and the redistribution layer, and positioning a fan-out component 15 between the heat sink layer and the redistribution layer and being in the encapsulation material 14.

Referring now additionally to FIGS. 3-9, an exemplary embodiment of a method for making the electronic device 10 is now described. It will be appreciated that the illustrated example produces two electronic devices boa, bob for illustrative purposes only, and that the disclosed method can manufacture more devices simultaneously using wafer level processing technology.

Figure 5:
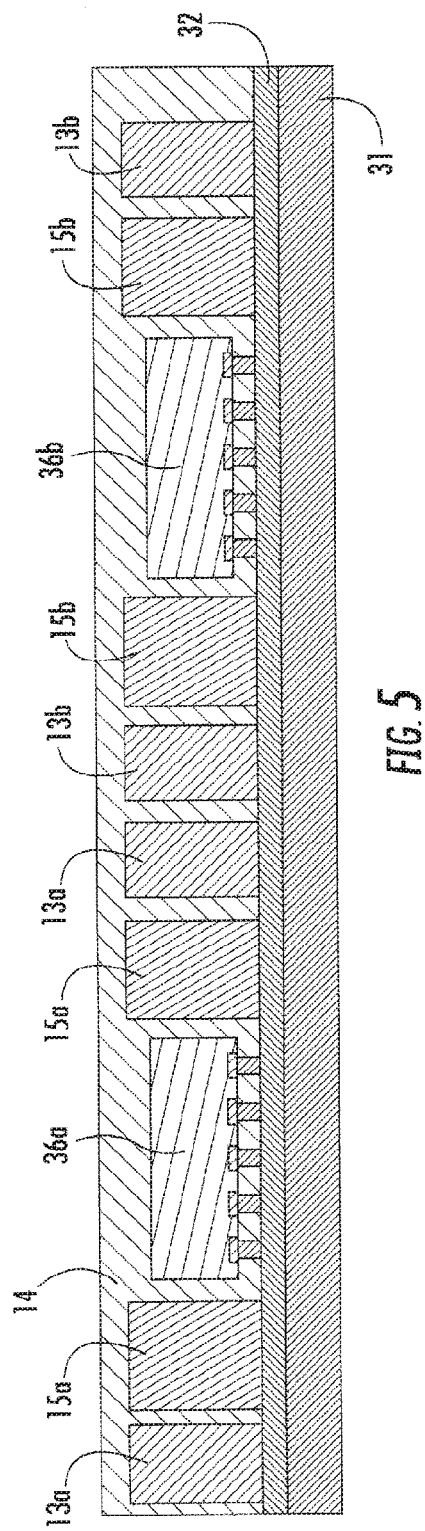
Figure 6:
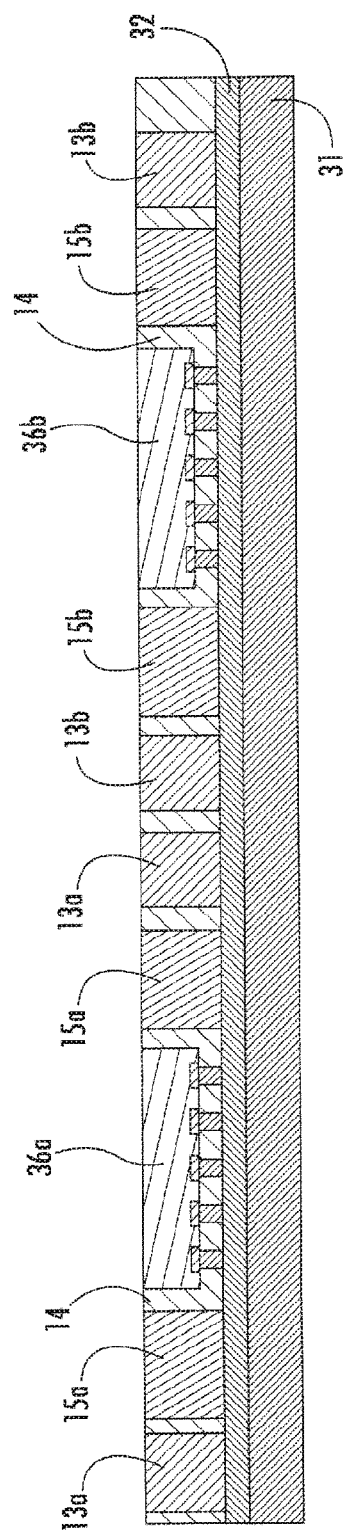
Figure 7:
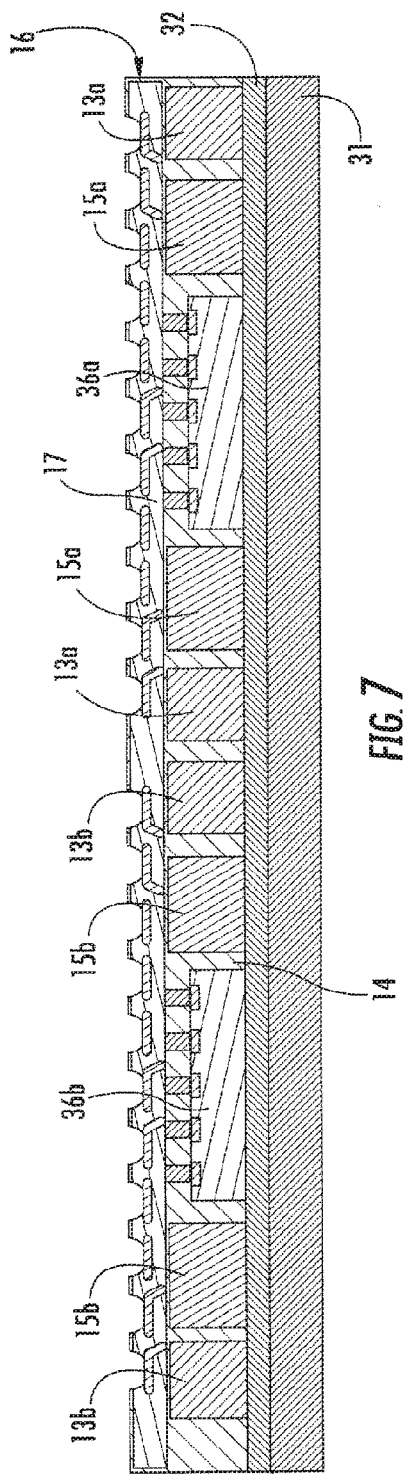
Figure 8:
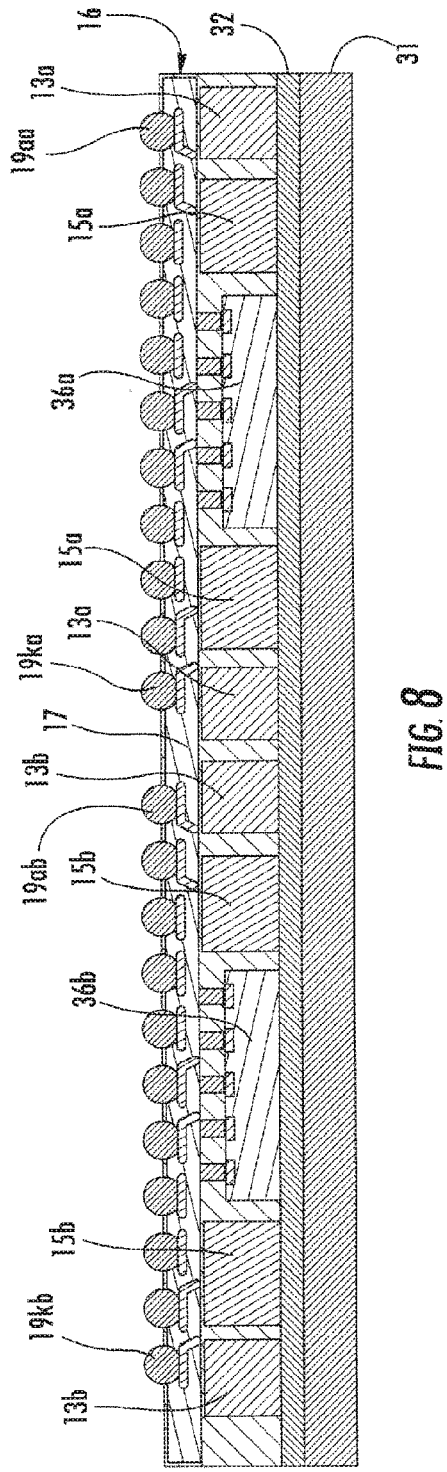
Figure 9:
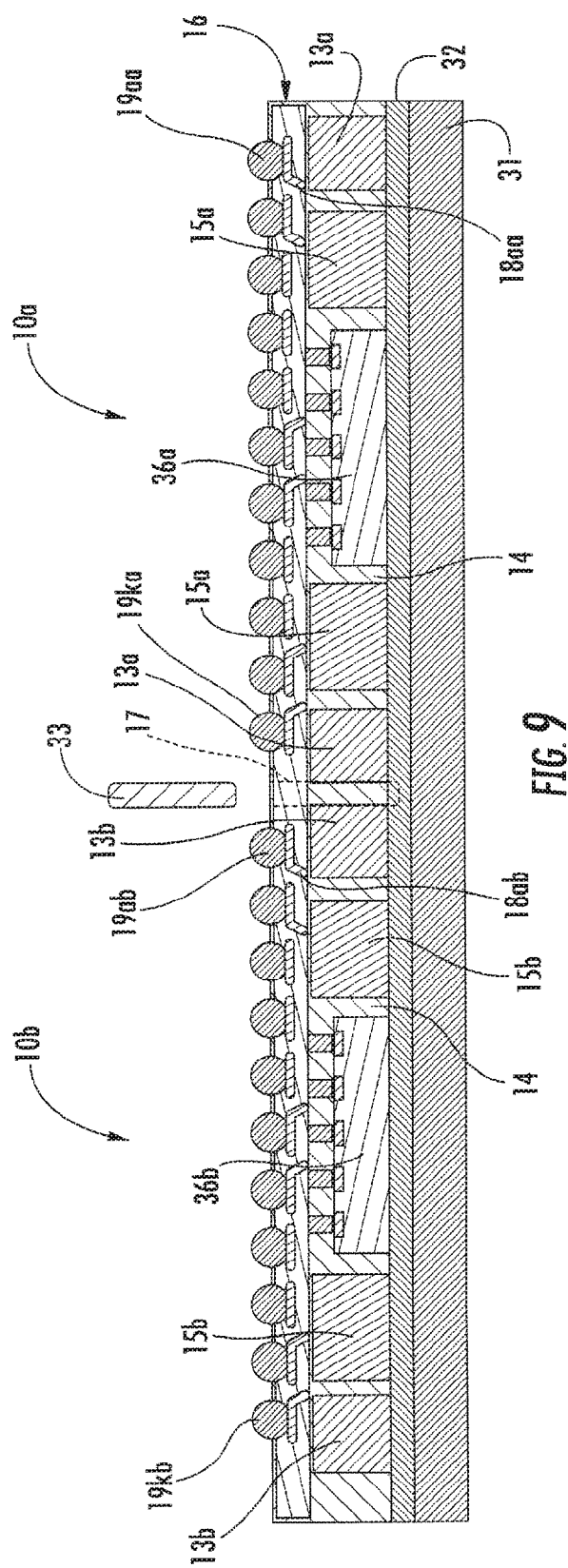

As shown in FIG. 3, the base for the manufacture steps is prepared and includes a carrier layer 31, and an adhesive layer 32 thereon. As shown in FIG. 4, the ICs 36a-36b, the fan-out components 15a-15b, and the stiffeners 13a-13b are placed on the adhesive layer 32, for example, using a pick and place (PnP) machine. As shown in FIG. 5, the encapsulation material 14 is formed over the carrier layer 31. As shown in FIG. 6, the upper surface of the carrier layer 31 is subjected to a grinding step to remove excess encapsulation material 14. As shown in FIG. 7, the encapsulated components are inverted on the carrier layer 31, and the redistribution layer 16 is formed. As shown in FIG. 8, the plurality of electrically conductive solder balls 19a-19k are formed adjacent the redistribution layer 16. As shown in FIG. 9, the molded panel or wafer or encapsulated components are singulated with an illustrative saw blade 33 (the saw blade stopping midway though the adhesive layer 32). The next phase would include dissolving the adhesive layer 32 to release the electronic devices 10a, 10b, and attaching respective heat sink layers 11a, 11b.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

What is claimed is:

1. A method of making an electronic device, the method comprising:
   providing an integrated circuit having a plurality of electrically conductive connectors coupled to a first surface of the integrated circuit;
   forming an encapsulation material surrounding the integrated circuit and the plurality of electrically conductive connectors;
   positioning a fan-out component adjacent the integrated circuit and separated therefrom by a portion of the encapsulation material;
   positioning a stiffener adjacent the fan-out component and separated therefrom by a second portion of the encapsulation material;
   electrically connecting a redistribution layer to the plurality of electrically conductive connectors; and
   positioning a heat sink adjacent a second surface of the integrated circuit, the second surface opposite the first surface, wherein the fan-out component and the stiffener extend vertically from the heat sink to the redistribution layer.

2. The method of claim 1, wherein the heat sink comprises a heat sink layer and a thermal interface layer between the heat sink layer and the integrated circuit.

3. The method of claim 1, further comprising electrically coupling a plurality of electrically conductive solder balls to the redistribution layer.

4. The method of claim 1, wherein the stiffener has an inner surface adjacent the encapsulation material and an outer surface defining an external surface of the electronic device.

5. The method of claim 1, wherein the plurality of electrically conductive connectors comprises solder bumps or pillars.

6. A method of making an electronic device, the method comprising:
  providing an integrated circuit having a plurality of electrically conductive connectors coupled to a first surface of the integrated circuit;
  forming an encapsulation material surrounding the integrated circuit and the plurality of electrically conductive connectors;
  positioning a fan-out component adjacent the integrated circuit and separated therefrom by a portion of the encapsulation material, wherein the fan-out component comprises an organic material or a ceramic material;
  positioning a stiffener adjacent the fan-out component and separated therefrom by a second portion of the encapsulation material;
  electrically connecting a redistribution layer to the plurality of electrically conductive connectors; and
  positioning a heat sink layer adjacent a second surface of the integrated circuit, the second surface opposite the first surface.

7. The method of claim 6, wherein the fan-out component comprises an organic material.

8. The method of claim 6, wherein the fan-out component a ceramic material.

9. A method comprising:
  forming a molded panel that includes a plurality of integrated circuits, a plurality of fan-out components and a plurality of stiffeners embedded in an encapsulation material;
  forming a redistribution layer over the integrated circuits and the fan-out components, the redistribution layer being electrically coupled to contacts of the integrated circuits; and
  singulating the molded panel to form a plurality of electronic devices, each electronic device comprising an integrated circuit that is separated from a fan-out component by a portion of the encapsulation material and a stiffener separated from the fan-out component by a second portion of the encapsulation material.

10. The method of claim 9, further comprising forming a heat sink layer adjacent the integrated circuit of each of the plurality of electronic devices.

11. The method of claim 10, further comprising forming a thermal interface layer between the heat sink layer and the integrated circuit.

12. The method of claim 9, further comprising attaching a plurality of electrically conductive solder balls to the redistribution layer.

13. The method of claim 9, wherein the fan-out components each comprise a ceramic material.

14. The method of claim 9, wherein the fan-out components each comprise an organic material.

15. The method of claim 9, wherein the redistribution layer comprises a dielectric layer and a plurality of electrically conductive traces carried by the dielectric layer, the electrically conductive traces being electrically coupled to contacts of the integrated circuits.

16. The method of claim 9, wherein, for each electronic device, the stiffener has an inner surface adjacent the encapsulation material and an outer surface defining an external surface of the electronic device.

17. A method comprising:
  adhering a plurality of integrated circuits, a plurality of fan-out components and a plurality of stiffeners to a carrier, the fan-out components each comprising a ceramic or organic material;
  forming an encapsulation material over the carrier and between the integrated circuits, fan-out components and stiffeners;
  forming a redistribution layer over the integrated circuits and the fan-out components;
  forming a plurality of electrically conductive solder balls adjacent the redistribution layer, the solder balls being electrically coupled to contacts of the integrated circuits through the redistribution layer; and
  performing a singulation step to form a plurality of electronic devices.

18. The method of claim 17, wherein the singulation step comprises sawing through the encapsulation material and dissolving an adhesive layer to release the electronic devices.

19. The method of claim 17, further comprising attaching a heat sink layer to each of the electronic devices.

20. The method of claim 17, further comprising performing a grinding step to remove excess encapsulation material from a lower surface of each integrated circuit, then attaching the lower surface of each integrated circuit to a temporary carrier, and then forming the redistribution layer.

21. The method of claim 17, wherein the adhering step comprises using a pick in place machine to place the integrated circuits, the fan-out components, and the stiffeners to an adhesive that overlies the carrier.

* * * * *